United States Patent
Chen

(10) Patent No.: US 6,246,079 B1
(45) Date of Patent: Jun. 12, 2001

(54) SCR CIRCUIT WITH A HIGH TRIGGER CURRENT

(75) Inventor: Wei-Fan Chen, Taichung (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/207,471

(22) Filed: Dec. 8, 1998

(30) Foreign Application Priority Data

May 13, 1998 (TW) ................................................ 87107421

(51) Int. Cl.$^7$ ............................ H01L 29/74; H01L 29/87
(52) U.S. Cl. .......................... 257/173; 257/109; 257/162; 257/356; 257/357; 257/362
(58) Field of Search .................................... 257/109, 146, 257/162, 173, 356, 357, 358, 362

(56) References Cited

U.S. PATENT DOCUMENTS 5,343,053 * 8/1994 Avery ..................................... 257/173
5,856,214 * 1/1999 Yu ......................................... 257/357

* cited by examiner

Primary Examiner—Jerome Jackson, Jr.
(74) Attorney, Agent, or Firm—Ladas & Parry

(57) ABSTRACT

An SCR with a high trigger current is provided in a P-type semiconductor substrate with an N-well formed therein. In the P-type semiconductor substrate, there is provided a P-type region and an N-type region. In the N-well, there is provided another P-type region and another N-well. The P-type region and the N-type region in the P-type region as well as another P-type region formed between the P-type semiconductor substrate and the N-well are connected to serve as a cathode of the SCR circuit, while the P-type region and the N-type region in the N-well are connected to serve as an anode of the SCR circuit. In addition, the anode can be formed only using a P-type region, and the cathode can be formed only using an N-type region.

14 Claims, 5 Drawing Sheets

SCR CIRCUIT WITH A HIGH TRIGGER CURRENT

GENERAL DESCRIPTION OF THE INVENTION

The present invention relates to an ESD protection circuit, and in particular, to an SCR circuit with a high trigger current which can avoid being triggered due to external noise or unexpected interference, thereby ensuring normal operations of the circuits to be protected.

BACKGROUND TO THE INVENTION

FIG. 1A (Prior Art) is a schematic structure of a conventional ESD protection circuit according to U.S. Pat. No. 5,012,317. In this case, a ESD protection circuit 20 is provided between a pad 12 to be protected and a reference ground, and is formed of a four-layer semiconductor device. An N-type layer 24 is formed adjacent to a P-type layer 22, a P-type layer 26 is formed adjacent to the N-type layer 24, and an N-type layer 28 is formed adjacent to the P-type layer 26. Further, the P-type layer 22 is connected to the pad 12 to be protected, and the N-type layer 28 is connected to the reference ground. A PN junction 30 is formed between the P-type layer 22 and the N-type layer 24, a PN junction 32 is formed between the N-type layer 24 and the P-type layer 26, and a PN junction 34 is formed between the P-type layer 26 and the N-type layer 28. Usually, a circuit such as ESD protection circuit 20 (four-layer semiconductor device) is called a silicon controlled rectifier (SCR) circuit.

FIG. 1B (Prior Art) is an equivalent circuit of the ESD protection circuit in FIG. 1A. As shown in FIG. 1B, a PNP transistor 36 has an emitter connected to the pad 12 to be protected, a base connected to a collector of an NPN transistor 38, and a collector connected to a base of the NPN transistor 38. The NPN transistor 38 has an emitter connected to the reference ground. Further, the emitter-base junction of the PNP transistor 36 is the PN junction 30, the collector-base junction of the NPN transistor 38 (or the PNP transistor 36) is the PN junction 32, and the emitter-base junction of the NPN transistor 38 is the PN junction 34. A resistor 40 is provided between the base of the NPN transistor 38 and the reference ground to increase the base current of the NPN transistor 38 when the collector current of the PNP transistor 36 is increased. Moreover, a resistor 42 is provided between the pad 12 and the base of the PNP transistor 36 to decrease the current gain of the PNP transistor 36.

As shown in FIG. 1A, when a positive impulse suddenly occurs at the base of the NPN transistor 38, the NPN transistor 38 is turned on with its collector voltage lowered and a current running through the collector-emitter junction of the NPN transistor 38. At this time, the PNP transistor 36 is active with its collector current running through the base of the NPN transistor 38, therefore, the SCR circuit will positively regenerate and cause the SCR circuit to remain on, even after the impulse at the base of the NPN transistor 38 fades away, until the collector current of the PNP transistor 36 is insufficient to drive on the NPN transistor 38.

FIG. 2 (Prior Art) is a schematic cross sectional diagram showing the SCR circuit in FIG. 1A and FIG. 1B in a semiconductor substrate. An N-well 46, as the N-type layer 24 in FIG. 1A, is defined in the lightly doped P-type semiconductor substrate 44. The PN junction 32 is formed between the N-well 46 and the P-type semiconductor substrate 44. A P-type region 48, as the P-type layer 22 in FIG. 1A, is defined on P-type semiconductor substrate 44. The PN junction 30 is formed between the P-type region 48 and the N-well 46. The P-type region 48 is connected to the pad 12 to be protected. An N-type region 50 is defined in the N-well 46 to provide resistive connect between the pad 12 and the N-well 46, so as to inversely turn on the PN junction 32 when negative transients.

Moreover, an N-type region 52, as the N-type layer 28 in FIG. 1A, is provided in the P-type semiconductor substrate 44 outside the N-well 46. The PN junction 34 is formed between the N-type region 52 and the P-type semiconductor substrate 44. A heavily doped P-type region 54 is formed in the P-type semiconductor substrate 44 outside the N-well 46 to provide a low resistance area, connected to the resistor 40 formed of the P-type semiconductor substrate 44, and connected to the N-type region 52 and the reference ground.

FIG. 3 (Prior Art) is a schematic diagram showing the current-voltage (I–V) characteristics of the SCR circuit in FIGS. 1A–1B and FIG. 2. When the voltage of the pad 12 gets smaller than an initial voltage $V_T$, which is usually ranged between 30V and 50V, the circuits to be protected perform normal operations as the segment A of FIG. 3. At this time, the PNP transistor 36 and the NPN transistor 38 of the SCR circuit are shut down (the current running through these two transistors approaches zero) without affecting the normal operations of the circuits to be protected. When the voltage of the pad 12, such as ESD noise or a large signal, exceeds the initial voltage $V_T$ and is inputted to the SCR circuit, the PNP transistor 36 is first turned on and absorbs a part of the current generated at the pad 12 due to ESD noise or a large signal as the segment B of FIG. 3. At this time, the NPN transistor 38 is shut down, and the collector current of the PNP transistor 36 is grounded through the resistor 40. After the voltage across the resistor 40 increases to exceed a threshold voltage $V_{TH}$ of the NPN transistor 38, the NPN transistor 38 of the SCR circuit is also turned on, and is structured accompanying the PNP transistor 36 as a positive regeneration circuit as the segment C of FIG. 3. At this time, the equivalent impedance of the SCR circuit approaches zero, so most of the current generated at the pad 12 can be absorbed by the SCR circuit due to this low impedance. As a result, the voltage of the pad 12 can be greatly decreased and the circuits to be protected can avoid damage caused by ESD noise or large currents.

However, because this SCR circuit is easily triggered by low currents, such as overshooting or undershooting, the circuit to be protected may also be mistakenly interrupted even under normal operations.

SUMMARY OF THE INVENTION

Therefore, an object of the present invention is to provide a SCR circuit with a high trigger current, which can avoid being triggered due to external noise or unexpected interference, thereby ensuring normal operations of the circuits to be protected.

According to a first aspect of the present invention, the SCR circuit is provided in the P-type semiconductor substrate with an N-well formed therein. In the P-type semiconductor substrate, there is provided a P-type region and an N-type region. In the N-well, there is provided another P-type region and another N-well. The P-type region and the N-type region in the P-type region, as well as another P-type region formed between the P-type semiconductor substrate and the N-well, are connected to serve as a cathode of the SCR circuit, while the P-type region and the N-type region in the N-well are connected to serve as an anode of the SCR circuit. When the voltage of the pad to be protected increases, the transistor constructed with the anode, the N-well and the P-type region formed between the P-type semiconductor substrate and the N-well is first turned on, absorbing a part of the current generated at the pad due to ESD noise or other currents and decreasing the voltage of the pad to some extent. When the voltage keeps increasing, the transistor constructed with the anode, the N-well and the P-type semiconductor substrate is also turned on, absorbing most of the current generated at the pad and greatly lowering the voltage thereof.

According to a second aspect of the present invention, the SCR circuit is provided in the P-type semiconductor substrate with an N-well formed therein. An N-type region is defined in the P-type semiconductor substrate. Another N-type region and a P-type region are defined in the N-well. The N-type region and the P-type region in the N-well are connected to serve as an anode of the SCR circuit. The N-type region in the P-type semiconductor substrate and another P-type region formed between the P-type semiconductor substrate and the N-well are connected to serve as a cathode of the SCR circuit.

According to a third aspect of the present invention, the SCR is provided in the P-type semiconductor substrate with an N-well defined therein. A P-type region is defined in the N-well to serve as an anode of the SCR circuit. An N-type region is then defined in the P-type semiconductor substrate and is connected with another p-type region formed between the P-type semiconductor substrate and the N-well to serve as a cathode of the SCR circuit.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE PREFERRED EMBODIMENT

Figure 1A:
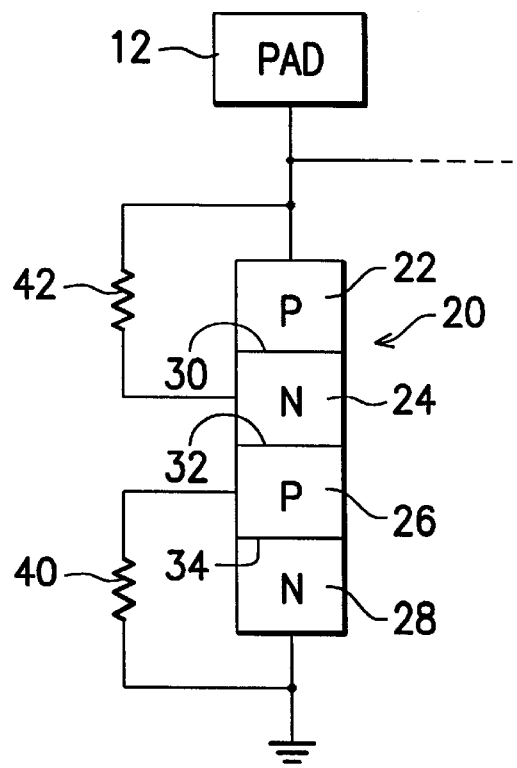
FIG. 1A (Prior Art) is a schematic structure of a conventional ESD protection circuit according to U.S. Pat. No. 5,012,317.
Figure 1B:
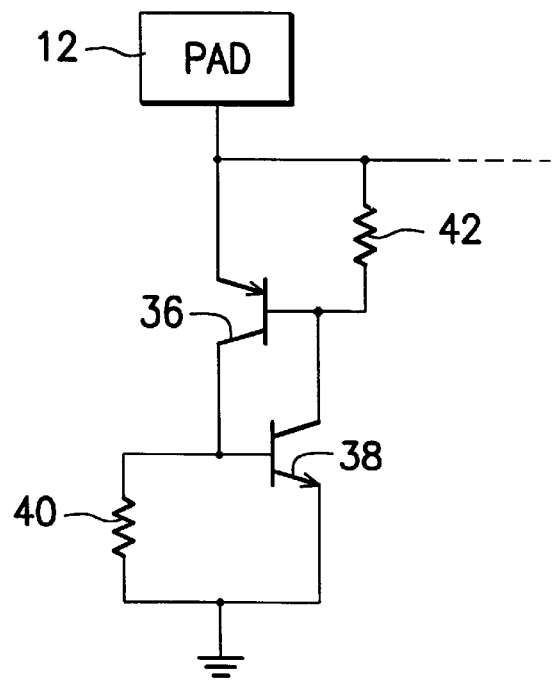
FIG. 1B (Prior Art) is an equivalent circuit of the ESD protection circuit in FIG. 1A.
Figure 2:
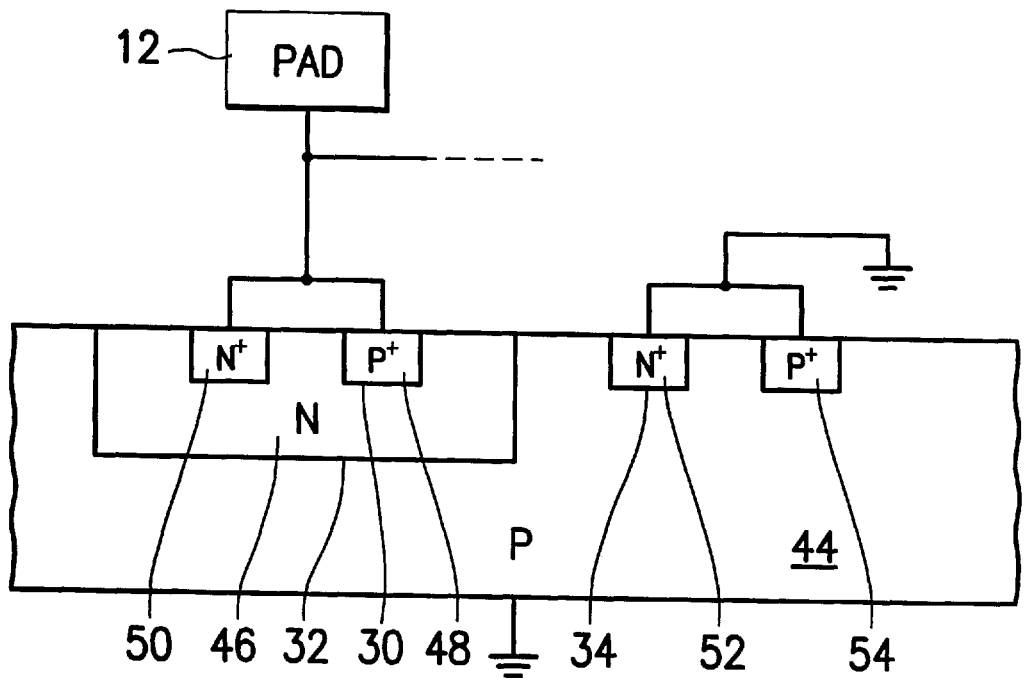
FIG. 2 (Prior Art) is a schematic cross sectional diagram showing the SCR circuit in FIG. 1A and FIG. 1B in a semiconductor substrate.
Figure 3:
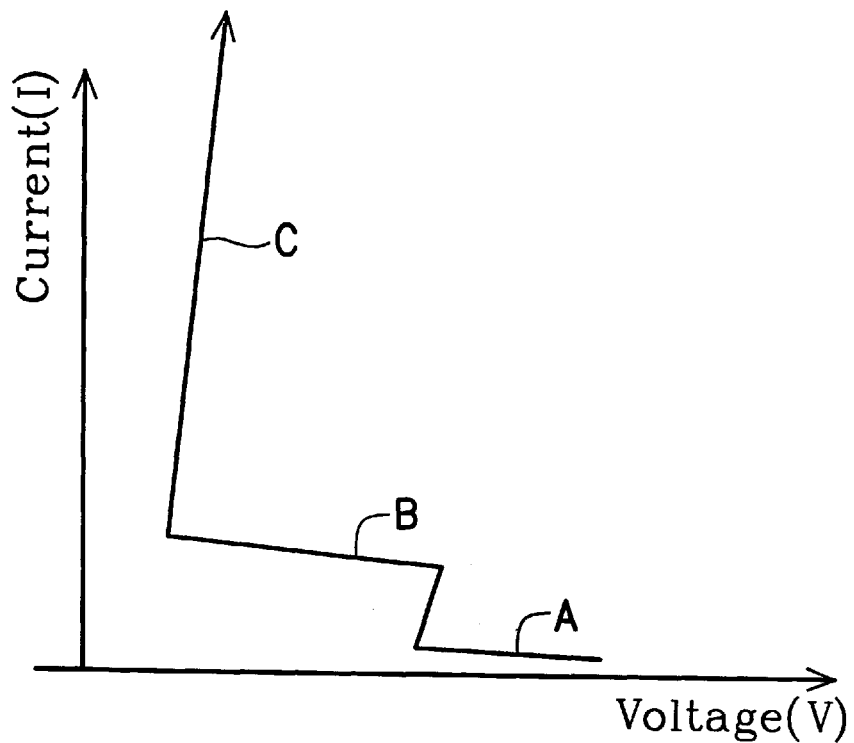
FIG. 3 (Prior Art) is a schematic diagram showing the current-voltage (I–V) characteristics of the SCR circuit in FIGS. 1A–1B and FIG. 2.
Figure 4:
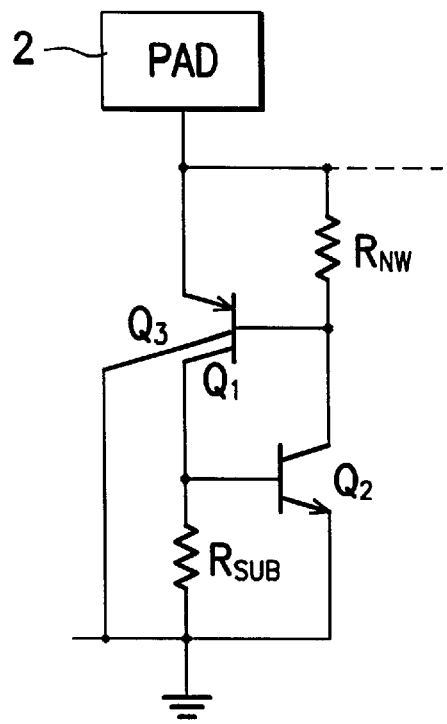
FIG. 4 is a schematic diagram showing an equivalent circuit of the SCR circuit according to the present invention.

FIG. 4 is a schematic diagram showing an equivalent circuit of the SCR circuit according to the present invention. The PNP transistors Q1, Q3 have their emitters connected to the pad 12 to be protected, bases connected to the collector of the NPN transistor Q2, and collectors respectively connected through a resistor $R_{SUB}$ to a reference ground and connected directly to the reference ground. Compared with the conventional SCR circuit, the PNP transistor Q3 is included in the present invention with its emitter and base in common with the PNP transistor Q1 and its collector connecting to the reference ground.

When the voltage of the pad 12 is abnormally increased to exceed a threshold voltage between the emitters and bases, the PNP transistor Q1, Q3 are first turned on to decrease the voltage of the pad 12 to some extent. At this time, the PNP transistor Q3 can absorb most of the current generated at the pad 12 for its low impedance because the collector of the PNP transistor is directly connected to the reference ground. Therefore, the collector current of the PNP transistor Q1 is much lower than that of conventional ones. This makes the SCR circuit absorb more current before turning on the NPN transistor Q2, so mistakes due to overshooting/undershooting or ESD noise can be greatly reduced.

Further, when the voltage of the pad 12 keeps increasing to the point the voltage across the resistor $R_{SUB}$ (between the base and the emitter of the NPN transistor Q2) exceeds the threshold voltage, the NPN transistor Q2 turns on and forms a positive regeneration circuit accompanying the PNP transistors Q1 and Q3. At this time, the equivalent impedance of the SCR circuit approaches zero, and the voltage of the pad 12 is rapidly decreased to protect the circuits connected to the pad 12. Moreover, the resistor $R_{NW}$ is connected between the bases of the PNP transistor Q1, Q3 and the pad 12 to be protected, lowering the current gain of the PNP transistors.

Figure 5A:
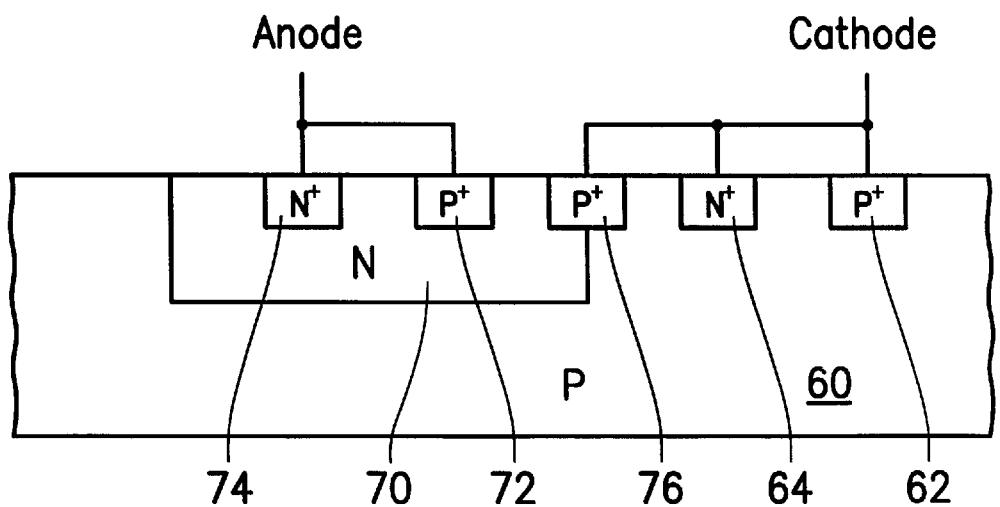
FIG. 5A to FIG. 5C are cross sectional diagrams showing three kinds of SCR circuits in a semiconductor substrate according to the present invention.
Figure 5B:
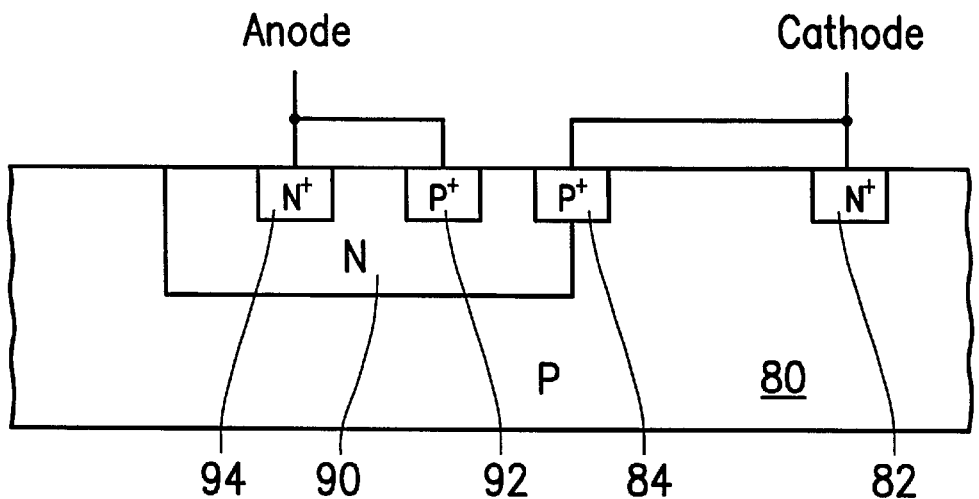
Figure 5C:
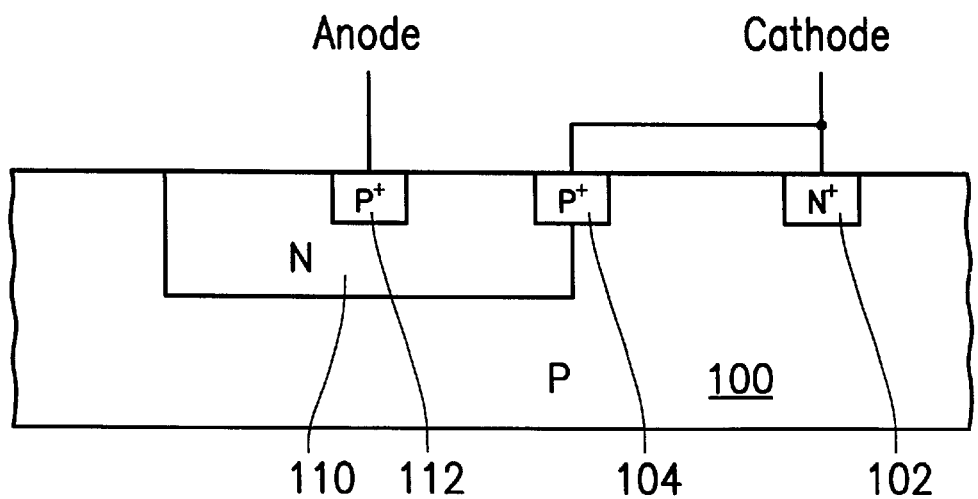

FIG. 5A to FIG. 5C are cross sectional diagrams showing three kinds of SCR circuits in a semiconductor substrate according to the present invention. In FIG. 5A, an N-well 70 is defined in the P-type semiconductor substrate 60. A P-type region 62 and an N-type region 64 are formed in the P-type semiconductor substrate 60. Another P-type region 72 and another N-type region 74 are formed in the N-well 70. Between the P-type semiconductor substrate 60 and the N-well 70 is formed a P-type region 76. The P-type region 72 and the N-type region 74 are connected to serve as an anode of the SCR circuit and connected to the pad 12 to be protected. In addition, the P-type region 62, the N-type region 64, and the P-type region 76 are connected to serve as a cathode of the SCR circuit and connected to the reference ground.

In this embodiment, the P-type region 72, the N-well 70 and the P-type semiconductor substrate 60 are structured as the PNP transistor Q1 of FIG. 4. The P-type region 72, the N-well 70 and the P-type region 76 are structured as the PNP transistor Q3. The N-well, the P-type semiconductor substrate 60 and the N-type region 64 are structured as the NPN transistor Q2 of FIG. 4. The junction between the P-type semiconductor substrate 60 and the N-well is structured as the resistor $R_{SUB}$. And the junction between the N-well 70 and the P-type region 72 is structured as the resistor $R_{NW}$.

When the voltage of the pad 12 increases to exceed the breakdown voltage between the N-well 70 and the P-type semiconductor substrate 60, the junction between the P-type region 72 and the N-well 70 is forward biased to make the longitudinal PNP transistor Q1 turn on. At this time, the junction between the semiconductor substrate 60 and the N-type region 64 is also forward biased to make the lateral NPN transistor Q2 turn on. As a result, the P-type region 72, the N-well 70, the P-type semiconductor substrate 60 and the N-type region 64 will construct a positive latch-up, greatly reducing on-state impedance to serve as an ESD circuit with a low holding voltage.

In this embodiment, the P-type semiconductor substrate 60 can be formed of a P-well located adjacent to the N-well 70. Or, the conductivity type of the semiconductor substrate 60 and the well 70 can be exchanged (N-type semiconductor substrate and P-well) for other applications.

FIG. 5B is a cross sectional diagram showing another SCR circuit implemented in a semiconductor substrate. In this embodiment, the cathode of the SCR circuit is implemented using only one doped region. As shown in FIG. 5B, an N-well 90 is defined in the P-type semiconductor substrate 80. A P-type region 92 and an N-type region 94 are formed in the N-well 90 and connected each other to provide an anode of the SCR circuit. In addition, a P-type region 84 formed between the P-type semiconductor substrate 80 and the P-well 90 is connected with the N-type region 82 formed in the P-type semiconductor substrate 80 to serve as a cathode of the SCR circuit. The operations of this SCR circuit are the same as the SCR circuit in FIG. 4 and are not repeated.

FIG. 5C is a cross sectional diagram showing a further SCR circuit implemented in a semiconductor substrate. In this embodiment, the anode and the cathode of the SCR circuit are both implemented using only one doped region. As shown in FIG. 5C, an N-type region 110 is defined in the P-type semiconductor substrate 100. A P-type region 112 is formed in the N-well 110 to serve as an anode of the SCR circuit. A P-type region 104 formed between the P-type semiconductor substrate 100 and the N-well 110 is connected with the N-type region 102 formed in the P-type semiconductor substrate 100 to serve as a cathode of the SCR circuit as shown in FIG. 5C. The operations of this SCR circuit are the same as the SCR circuit in FIG. 4 and are not repeated.

Figure 6:
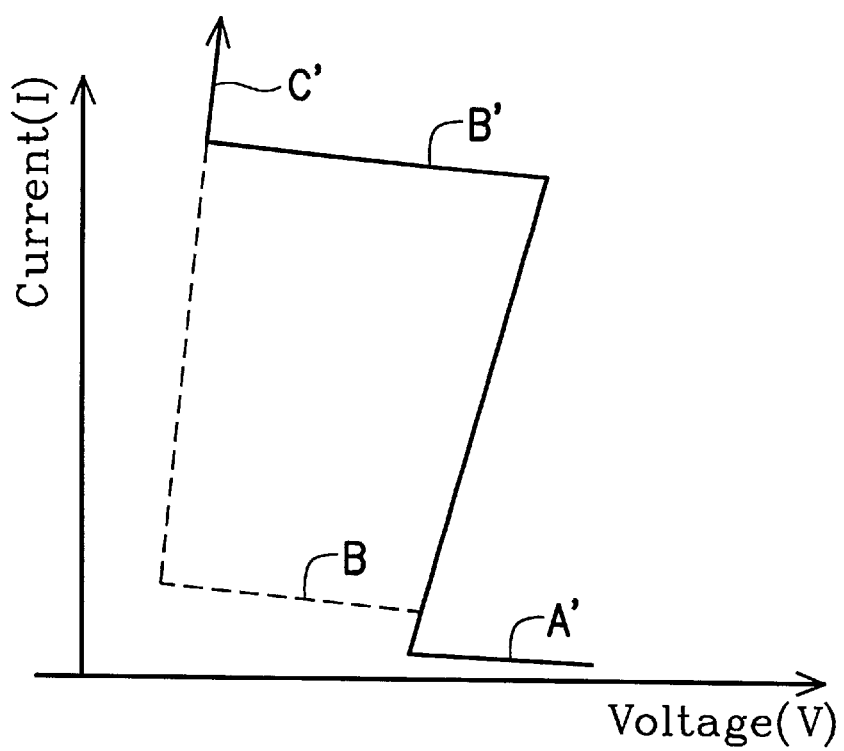
FIG. 6 is a schematic diagram showing the current-voltage (I–V) characteristics of the SCR circuit according to the present invention.

FIG. 6 is a schematic diagram showing the current-voltage (I–V) characteristics of the SCR circuit according to the present invention. In FIG. 6, the dash line represents the current-voltage (I–V) characteristics of conventional SCR circuits, and the solid line represents the current-voltage (I–V) characteristics of the present SCR circuit. When the voltage of the pad 12 is smaller than the initial voltage $V_T$, the circuits connecting the pad 12 can normally operate as the segment A' of FIG. 6. At this time, the PNP transistor Q1, Q3 and the NPN transistor Q2 of the present SCR circuit are shut down (the current running through these transistors approaches zero). When the voltage of the pad 12 (such as ESD noise or large signal output) increases to exceed the initial voltage $V_T$ and is inputted to the SCR circuit, the PNP transistor Q1, Q3 first turn on and absorb a part of the current generated at the pad 12. The collector of the PNP transistor Q3 is directly connected to a reference ground, so most of the current runs through the PNP transistor Q3 as the segment B' of FIG. 6. As a result, this SCR circuit can absorb more current and a higher trigger current before the NPN transistor Q2 is turned on. After the voltage across the resistor RNW increases to exceed the threshold voltage $V_{TH}$ of the NPN transistor Q2, the SCR circuit can operate as a positive regeneration circuit, greatly reducing the on-state impedance and the voltage of the pad 12. Therefore, the SCR circuit can avoid being triggered due to external noise or unexpected interference as the segment C' of FIG. 6.

Figure 7:
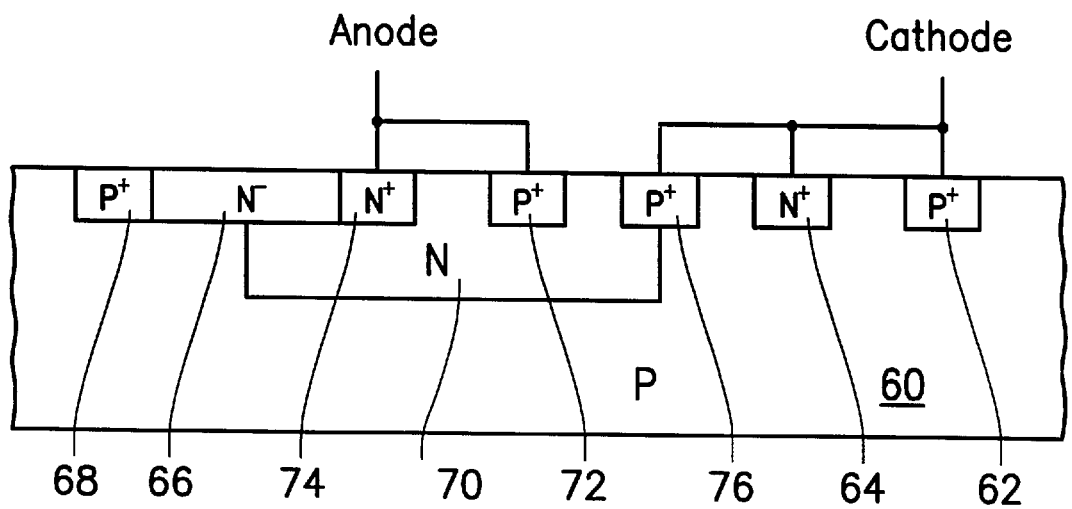
FIG. 7 is a cross sectional diagram showing a zener diode trigger SCR circuit according to the present invention.

In addition to the high trigger current, the SCR circuit can also be used in other applications. FIG. 7 is a cross sectional diagram showing a zener diode trigger SCR circuit according to the present invention. In this case, the SCR circuit is the same as the SCR circuit in FIG. 5A and uses the same notations. The anode of the SCR circuit is connected in series with a zener diode constructed with an N-type region 66 and a P-type region 68. The zener diode is used as a further discharge path for the ESD current when the voltage of the pad 12 increases.

Summing up the above, the SCR circuit of the present invention has a higher trigger current than conventional ones, and can avoid being triggered due to external noise or unexpected interference, thereby ensuring normal operations of the circuits to be protected.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enabling those who are skilled in the art to understand the invention for various embodiments and with various modifications as are suited to the particular use contemplated. It is intended that the scope of the invention be defined by the following claims and their equivalents.

What is claimed is:

1. An SCR circuit with a high trigger current, formed on a semiconductor substrate of a first conductivity type, comprising:
   a well of a second conductivity type formed in the semiconductor substrate;
   a first region of the first conductivity type and a second region of the second conductivity type, respectively formed in the well and being connected with each other to serve as an anode of the SCR circuit;
   a third region of the first conductivity type and a fourth region of the second conductivity type, respectively formed in the semiconductor substrate; and
   a fifth region of the first conductivity type formed between the semiconductor substrate and the well, directly connected to the third region and the fourth region to serve as a cathode of the SCR circuit.

2. The SCR circuit with a high trigger current as claimed in claim 1, wherein the first conductivity type is P type and the second conductivity type is N type.

3. The SCR circuit with a high trigger current as claimed in claim 2, wherein the semiconductor substrate is formed of a P-type silicon substrate, and the well is formed of an N-type lightly doped region.

4. The SCR circuit with a high trigger current as claimed in claim 2, wherein the semiconductor substrate is formed of a P-well adjacent to the well of the second conductivity type.

5. An SCR circuit with a high trigger current, formed on a semiconductor substrate of a first conductivity type, comprising:
   a well of a second conductivity type formed in the semiconductor substrate;
   a first region of the first conductivity type and a second region of the second conductivity type, respectively formed in the well and being connected with each other to serve as an anode of the SCR circuit;
   a third region of the second conductivity type formed in the semiconductor substrate; and
   a fourth region of the first conductivity type formed between the semiconductor substrate and the well, directly connected to the third region to serve as a cathode of the SCR circuit.

6. The SCR circuit with a high trigger current as claimed in claim 5, wherein the first conductivity type is P type and the second conductivity type is N type.

7. The SCR circuit with a high trigger current as claimed in claim 6, wherein the semiconductor substrate is formed of a P-type silicon substrate, and the well is formed of an N-type lightly doped region.

8. The SCR circuit with a high trigger current as claimed in claim 6, wherein the semiconductor substrate is formed of a P-well adjacent to the well of the second conductivity type.

9. An SCR circuit with a high trigger current, formed in a semiconductor substrate of a first conductivity type, comprising:
- a well of the second conductivity type formed in the semiconductor substrate;
- a first region of the first conductivity type formed in the well to serve as an anode of the SCR circuit;
- a second region of the second conductivity type formed in the semiconductor substrate; and
- a third region of the first conductivity type formed between the semiconductor substrate and the well, directly connected to the second region to serve as a cathode of the SCR circuit.

10. The SCR circuit with a high trigger current as claimed in claim 9, wherein the first conductivity type is P type and the second conductivity type is N type.

11. The SCR circuit with a high trigger current as claimed in claim 10, wherein the semiconductor substrate is formed of a P-type silicon substrate, and the well is formed of an N-type lightly doped region.

12. The SCR circuit with a high trigger current as claimed in claim 10, wherein the semiconductor substrate is formed of a P-well formed adjacent to the well of the second conductivity type.

13. A zener diode trigger SCR circuit, formed in the semiconductor substrate of a first conductivity type, comprising:
- a well of a second conductivity type formed in the semiconductor substrate;
- a first region of the first conductivity type and a second region of the second conductivity type, respectively formed in the well and being connected with each other to serve as an anode of the SCR circuit;
- a third region of the first conductivity and a fourth region of the second conductivity type, respectively formed in the semiconductor substrate;
- a fifth region of the first conductivity type formed between the semiconductor substrate and the well, connected to the third region and the fourth region to serve as a cathode of the SCR circuit;
- a sixth region of the second conductivity type formed between the semiconductor substrate and the well, being adjacent to the second region; and
- a seventh region of the first conductivity type formed in the semiconductor substrate, being adjacent to the sixth region to serve as a zener diode.

14. The SCR circuit with a high trigger current as claimed in claim 13, wherein the first conductivity type is P type and the second conductivity type is N type.

* * * * *